United States Patent
Tsorng et al.

(10) Patent No.: US 11,598,132 B2
(45) Date of Patent: Mar. 7, 2023

(54) DOUBLE SHAFT 180 DEGREES ROTATION SHEET METAL MECHANISM

(71) Applicant: QUANTA COMPUTER INC., Taoyuan (TW)

(72) Inventors: Yaw-Tzorng Tsorng, Taoyuan (TW); Chun Chang, Taoyuan (TW); Ching-Cheng Kung, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 1002 days.

(21) Appl. No.: 16/379,225

(22) Filed: Apr. 9, 2019

(65) Prior Publication Data
US 2020/0325713 A1  Oct. 15, 2020

(51) Int. Cl.
*E05D 3/12* (2006.01)
*E05D 5/04* (2006.01)
*H05K 7/14* (2006.01)

(52) U.S. Cl.
CPC .............. *E05D 3/12* (2013.01); *E05D 5/04* (2013.01); *H05K 7/1489* (2013.01); *E05Y 2900/208* (2013.01); *H05K 7/1491* (2013.01)

(58) Field of Classification Search
CPC ... Y10T 16/547; Y10T 16/552; Y10T 16/558; E05D 3/12; E05D 5/04; E05D 5/046; E05D 5/14; H05K 7/1489; H05K 7/1491; H05K 5/0226; E05Y 2900/208; G06F 1/181
USPC ....................... 49/381, 399; 16/366, 387, 378
See application file for complete search history.

(56) References Cited

U.S. PATENT DOCUMENTS

| 1,375,212 | A | * | 4/1921 | Crone | ...................... E05D 3/02 296/50 |
| 4,823,858 | A | * | 4/1989 | Perutz | ................... E04B 2/7405 16/366 |
| 5,107,652 | A | * | 4/1992 | Sosa | ....................... E04C 1/395 52/586.1 |
| 2011/0271484 | A1 | * | 11/2011 | Irwin | .................... E05D 11/105 16/273 |

(Continued)

FOREIGN PATENT DOCUMENTS

| BE | 886866 A | 4/1981 |
| CN | 2791721 Y | 6/2006 |

(Continued)

OTHER PUBLICATIONS

CN Office Action for Application No. 201910592096.8, dated Sep. 15, 2021, w/ First Office Action Summary.

(Continued)

*Primary Examiner* — William L Miller
(74) *Attorney, Agent, or Firm* — Nixon Peabody LLP (57) ABSTRACT

The present disclosure is directed to a system for providing substantially 180 degrees, or more, of rotation between a sheet metal door mounted on a sheet metal sidewall of a chassis, relative to the chassis. The system includes a first and a second shaft passing through a module positioned between the door and the sidewall, whereby the door rotates about the two shafts, where the two shafts are not axially aligned. The chassis may hold sleds of a server, and the door may further comprise multiple linking modules, such that the sleds are coupled to the linking modules when the door is in a closed position, and the sleds are slid home within the chassis.

9 Claims, 9 Drawing Sheets

(56) References Cited

U.S. PATENT DOCUMENTS

| | | | | |
|---|---|---|---|---|
| 2014/0352107 A1* | 12/2014 | Cox | ............... | E05D 7/123 16/50 |
| 2017/0138103 A1 | 5/2017 | Hong et al. | | |
| 2019/0300142 A1* | 10/2019 | Helsley | ............ | E05F 1/1215 |

FOREIGN PATENT DOCUMENTS

| CN | 200993754 Y | 12/2007 |
|---|---|---|
| CN | 205206548 U | 5/2016 |
| CN | 105756490 A | 7/2016 |
| IT | UA20163698 A1 | 11/2017 |
| JP | H0941776 A | 2/1997 |
| JP | H10238198 A | 9/1998 |
| JP | 2006020422 A | 1/2006 |
| JP | 2017-125364 A | 7/2017 |
| JP | 2018-190881 A | 11/2018 |
| TW | 200723995 A | 6/2007 |

OTHER PUBLICATIONS

CN Search Report for Application No. 201910592096.8, dated Sep. 15, 2021, w/ First Office Action.
Extended European Search Report for EP Application No. 19193926.3, dated Mar. 26, 2020.
TW Office Action for Application No. 108119827, dated Oct. 8, 2019, w/ First Office Action Summary.
TW Search Report for Application No. 108119827, dated Oct. 8, 2019, w/ First Office Action.
JP Office Action for Application No. 2019-164148, dated Sep. 29, 2020, w/ First Office Action Summary.
Communication Pursuant to Article 94(3) in European Application No. 19193926.3 dated Sep. 21, 2022.

* cited by examiner

DOUBLE SHAFT 180 DEGREES ROTATION SHEET METAL MECHANISM

FIELD OF THE INVENTION

The technical field to which this invention pertains is access to an interior of a server. Access to the interior of servers is currently provided by a side door. An ordinary sheet metal rotating mechanism on a flip door or rotating cover has a limit on the angle of rotation as constrained by the sheet metal's geometry. The present disclosure provides a dual axis metal mechanism to permit 180 degrees of rotation on a flip door. Using a double shaft flip door mechanism affords door opening to 180 degrees, and provides a large opening on the side chassis so that usability and serviceability of a linking board module or cable routing will be more user friendly.

BACKGROUND

Computing demand is growing continuously. GPU servers have evolved to multi-sled systems with heights of 7, 8, or even 10 U. In expectation of maximizing computing density of servers, the width of the mother board or GPU board is as wide as possible. For example, the HGX2 baseboard from NVidia is 416 mm in width. While the width of a standard server is 440-448 mm, there is only a limited amount of space between the sides of chassis and the sled. Therefore, connections between each sled become a key point in such systems.

A known server uses a side door with a linking board module to achieve connecting with each sled, and even allows the sled to be installed or extracted simply and without cable routing. An ordinary sheet metal rotating mechanism on a flip door or rotating cover has a limit on the amount of rotation angle constrained by the geometry of the sheet metal. The limit of rotation on existing flip doors or rotating covers is about 110 degrees. This limited degree of rotation effectively limits the access through the opening.

Typical flip doors utilize couple "C" geometry on two sheet metal parts, with a pin through the "C" becoming a rotary axis shaft. Such geometry is simple to fabricate but has a limit on rotation angle caused by the interference of the rotatable parts, and therefore limits the degree of rotation to about 110 degrees.

Therefore, it would be desirable to increase the angle of rotation beyond the limits of about 110 degrees with existing flip doors. The increase in the degree of rotation permits easier access to the interior of the chassis, including sleds contained therein. Such an increase in the angle of rotation of the door or cover permits useability and serviceability of linking board modules, and permits the sleds to be installed in the server without cabling. More user friendly access is achieved through the use of the disclosed embodiments that permit door rotation on the order of 180 degrees.

SUMMARY

A structure and method of increasing the degree of rotation of flip doors beyond about 110 degrees, so as to fully rotate through an angle of 180 degrees is disclosed.

In one embodiment, existing sheet metal flip door geometry can be modified by the inclusion of a module to receive a second shaft passing through the module. The module is also fitted to the existing shaft of the sheet metal flip door.

In another embodiment, the module includes a first portion designed to receive the existing shaft of a sheet metal flip door. The module also includes, as a second portion, a second shaft receiving portion which meshes with the existing sheet metal edge of a conventional side wall of a server.

In a further embodiment, existing sheet metal geometry of the chassis of a server can be modified with a module. The module is structured to mesh with the existing sheet metal geometry and is secured to the existing sheet metal edge of the chassis by a first shaft. The module also provides one or more receivers to receive a second shaft to connect the shaft to a side mounted chassis door.

In a still further embodiment, the flip door is capable of a degree of rotation of substantially 180 degrees and can also be provided with linking board modules mounted on the flip doors. With guide-pin and floating designed linking boards, one can easily simultaneously install the sled and make the cabling connection between the sled and linking boards by only sliding the sled home within the server. Rail assembly technology permits two sleds to be mounted one above the other within the sheet metal chassis of a computing device, such as a server mounted in a rack. This obviates the need for manual cable routing or assembling or disassembling of the linking board after sled installation. Rotation of the flip door, upon which the linking modules are mounted, into a closed position permits the male guide pin connectors to guide and connect the linking boards to the female guide pin connectors located on the sleds.

These and other objects and embodiments of the structure and function of the disclosure will be understood with reference to the detailed description and the appended drawings.

DETAILED DESCRIPTION

The present disclosure can be embodied in many different forms. Representative embodiments are shown in the drawings, and will herein be described in detail. These embodiments are examples or illustrations of the principles of the disclosure but are not intended to limit its broad aspects. To that extent, elements and limitations that are disclosed, for example, in the Abstract, Summary, and Detailed Description sections, but not explicitly set forth in the claims, should not be incorporated into the claims, singly or collectively, by implication, inference, or otherwise. For purposes of the present detailed description, unless specifically disclaimed, the singular includes the plural and vice versa; and the word "including" means "including without limitation." Moreover, words of approximation, such as "about," "almost," "substantially," "approximately," and the like, can be used herein to mean "at," "near," or "nearly at," or "within 3-5% of," or "within acceptable manufacturing tolerances," or any logical combination thereof, for example.

Figure 1:
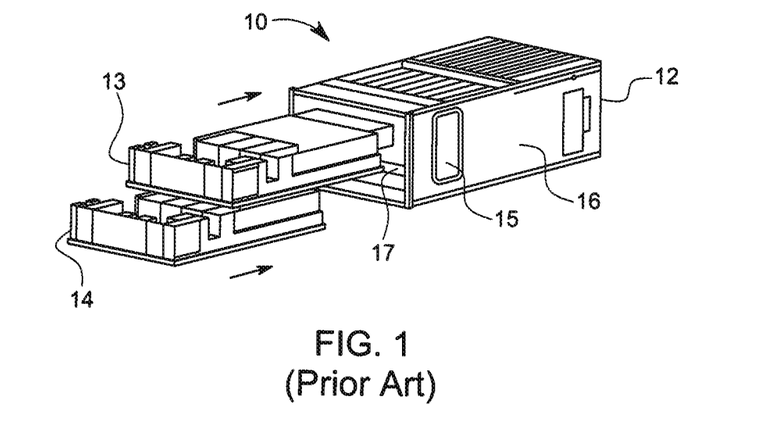
FIG. 1 (PRIOR ART) is a schematic, perspective view of a server chassis designed to accept two sleds positioned one above the other.

FIG. 1 (PRIOR ART) is a schematic, perspective view of a server 10, including a chassis 12 designed to accept two sleds 13, 14, and positioned one above the other. Rails or other devices (not shown) mounted inside the chassis 12 accept and guide the sleds into position as they are slid home. The chassis 12 is provided with a flip door 15 in a sidewall 16 of the chassis 12 to permit access to the interior 17 of the server 10.

Figure 2:
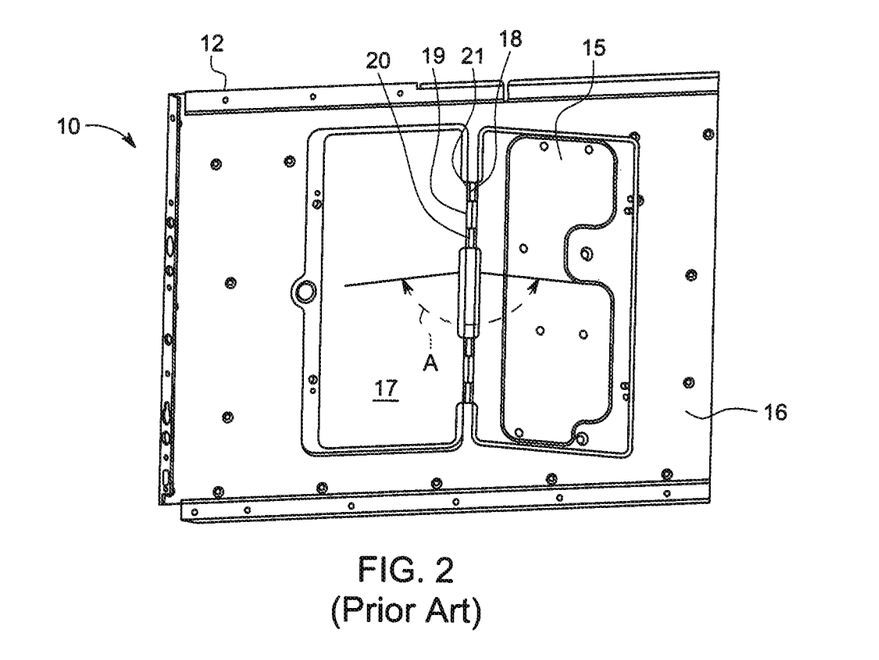
FIG. 2 (PRIOR ART) is a schematic, front view of an existing flip door with a limit of rotation of about 110 degrees.

An enlarged view of the flip door 15 in sidewall 16 of the chassis 12 is illustrated in FIG. 2 (Prior Art). As shown in FIG. 2, the angle of rotation of the flip door 15 about a pin 18 passing through the sheet metal edge portions 20, 21 of the flip door 15 and the sheet metal edge portion 19 of sidewall 16 is limited to about 110 degrees.

Figure 3A:
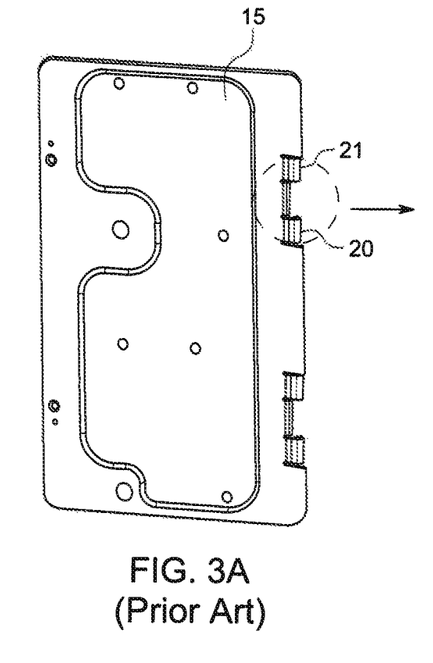
FIGS. 3A and 3B (Prior Art) are an enlarged view of the sheet metal forming the "C" geometry to receive a single shaft.
Figure 3B:
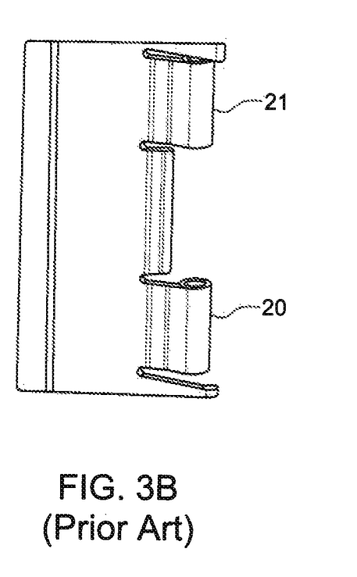

FIG. 3A (Prior Art) shows the geometry of existing sheet metal edge portions 20, 21 of the flip door 15. FIG. 3B (Prior Art) is an enlargement of the geometry of the existing sheet metal edge portions 20, 21 of the flip door 15. The geometry of these sheet metal edge portions 20, 21 limits the degree of rotation of the flip door 15 about pin 18 to about 110 degrees, as shown by the arrow A in FIG. 2. Thus, the access to the interior 17 of the server 10 and its components (in FIG. 2), is restricted by the construction and geometry of the flip door 15 and sidewall 16, which has a limited degree of rotation.

Figure 4:
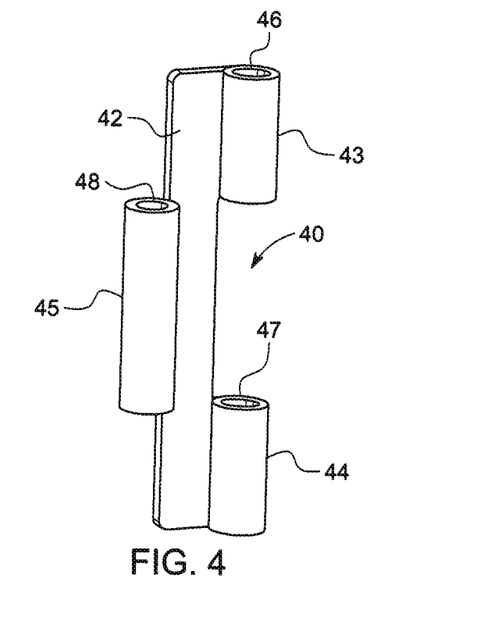
FIG. 4 is a schematic elevation view of the module to enable a degree of rotation of about 180 degrees.

FIG. 4 illustrates the module 40 according to the present disclosure. Module 40 comprises a central core 42 to which upper portion 43 and lower portion 44 are attached. Upper portion 43 and lower portion 44 are configured to receive a first shaft (not shown in FIG. 4). Upper portion 43 defines a shaft receiving opening 46. Lower portion 44 defines its own shaft receiving opening 47. Shaft receiving openings 46 and 47 are positioned in axial alignment, such that a shaft having a longitudinal axis may pass through opening 46 and can be received in opening 47. A second shaft receiving portion 45 is also positioned on the central core 42. Second shaft receiving portion 45 also defines a shaft receiving opening 48. However, shaft receiving opening 48 is not aligned with either of shaft receiving openings 46 or 47. The central core 42 may be integrally formed with upper portion 43, lower portion 44, and second shaft receiving portion 45. The module 40 may be formed of various materials, such as metal, plastic, or a composite. Preferably, module 40 is formed of metal. The module 40 may be formed of metal which is cast, forged, and machined; or formed of sheet metal fabricated as one piece having the various component portions of the central core 42 and various shaft receiving portions 43, 44, and 45 formed or shaped as an integral unit. The module 40 has been designed to increase the degree of rotation of flip door 15 without the need to modify the geometry of existing sheet metal edge portion 19 of sidewall 16 of existing servers, nor modify the existing flip doors 15. The module 40 can therefore be used as a retrofit device on existing servers having flip door 15 of limited angular rotation to increase the degree of rotation from about 110 degrees to substantially 180 degrees, or more. Even though it is to be understood that the module 40 can therefore be used to retrofit existing flip door 15 to increase the degree of rotation relative to the sidewall 16 of an existing chassis 12, module 40 can also be used as a device for newly manufactured chassis 12 as well.

Figure 5:
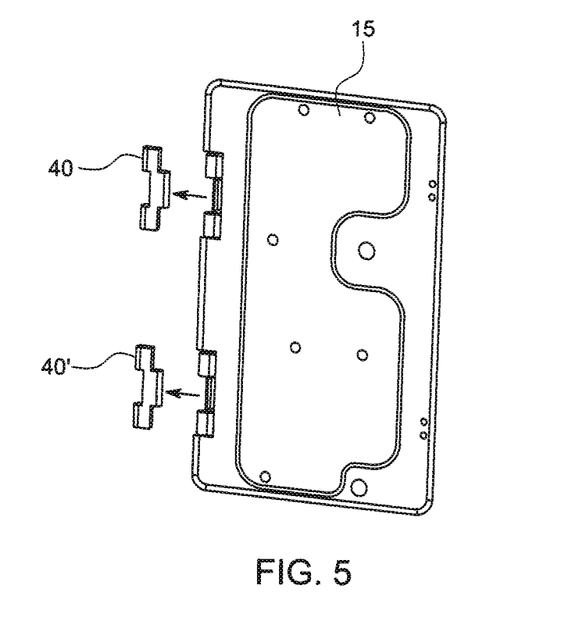
FIG. 5 is a schematic illustration of the placement of the module of FIG. 4 on an existing flip door.

FIG. 5 illustrates the relative position of module 40 in relation to flip door 15. In the embodiment of FIG. 5, there are provided two identical modules 40 and 40'. However, it is to be understood that the number of modules employed may vary with the design of flip door 15, and a greater or fewer number of modules can be used than as shown in FIG. 5. Also, the number of flip doors 15 per side of the chassis can be one, or greater than one, depending on the need to access the interior of the chassis and/or the sleds contained therein.

Figure 6:
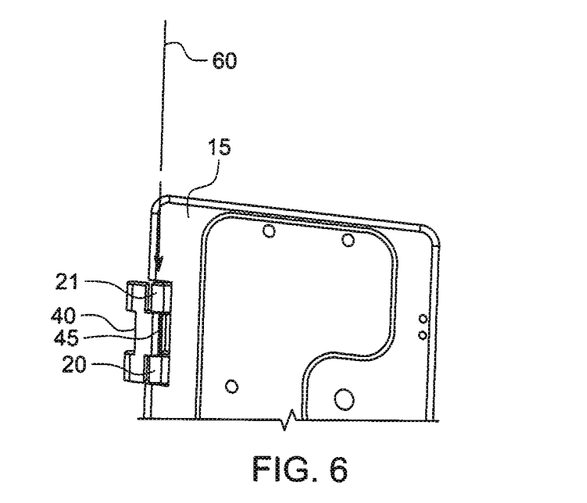
FIG. 6 illustrates the placement of a first shaft to secure the module of FIG. 4 to the flip door.

FIG. 6 illustrates the placement of a first shaft 60 into the shaft receiving sheet metal edge portion 21 of flip door 15. After passing through sheet metal edge portion 21 of flip door 15, the shaft will successively pass through shaft receiving portion 45 of module 40, and then sheet metal edge portion 20 of flip door 15. The first shaft 60 will pass through the respective opening of all additional modules in a similar manner.

Figure 7:
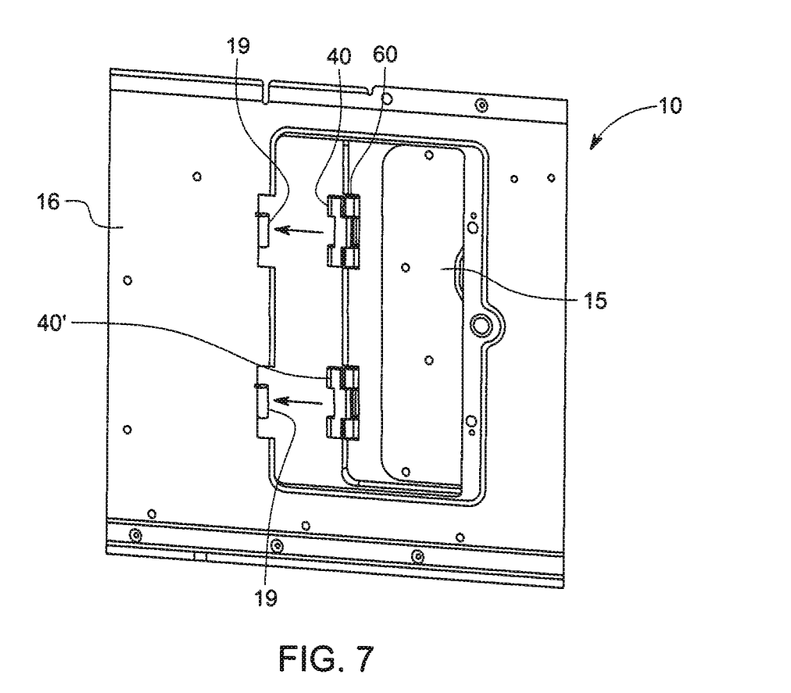
FIG. 7 is a schematic illustration of the assembled module and flip door of FIG. 6 in relation to the side wall of a server chassis.

FIG. 7 shows the placement of a second module 40' below a first module 40. Second module 40' is positioned in alignment with first module 40 so as to receive the lower end of the first shaft 60 after the first shaft 60 passes through first module 40. FIG. 7 also illustrates the assembled modules 40, 40' with flip door 15 prior to being assembled to the sheet metal edge portion 19 of sidewall 16 of chassis 12.

Figure 8:
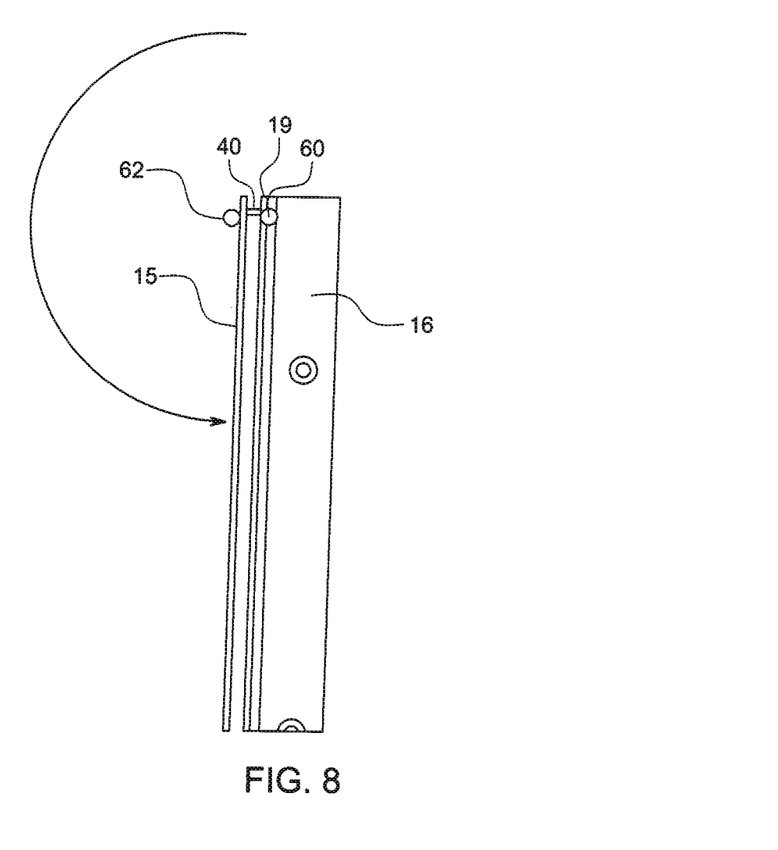
FIG. 8 is a schematic illustration of a top view showing the placement of a second shaft to secure the assembled module and flip door of FIG. 6 to the side wall of a server chassis.

FIG. 8 illustrates the placement of a second shaft 62 through module 40 and sheet metal edge portion 19 of sidewall 16. Similar to the manner of passing the first shaft 60 though module 40, the second shaft 62 will initially engage and then pass through upper portion 43 of module 40; then successively through sheet metal edge portion 19 of sidewall 16; and finally through lower portion 44 of module 40. In this manner flip door 15 will be rotatably secured to the sidewall 16 of the chassis 12.

Figure 9:
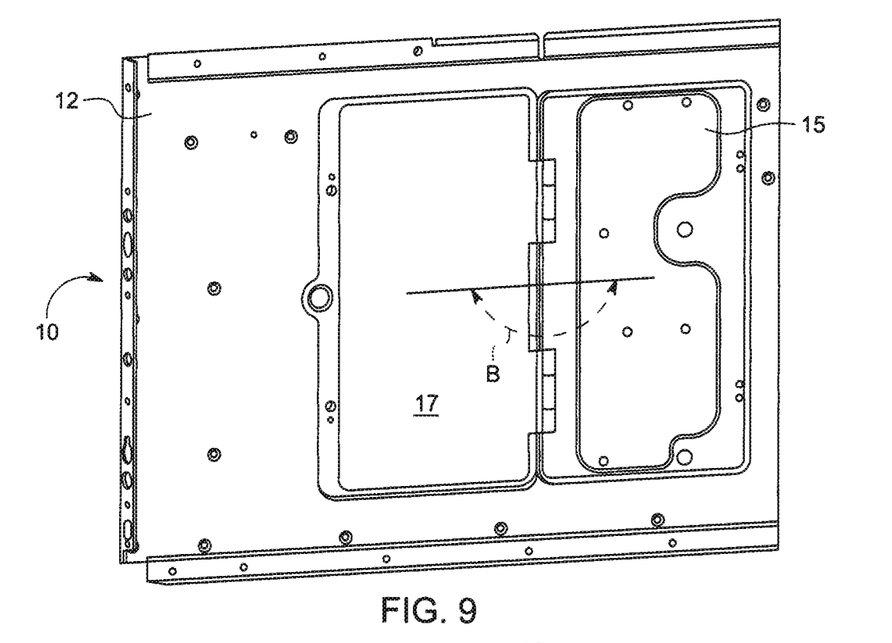
FIG. 9 is a schematic illustration showing the assembled module and flip door in its 180 degree opened position on a sidewall of a server chassis.

FIG. 9 illustrates the greater degree of rotation of flip door 15 with regard to sidewall 16 of the chassis 12. Flip door 15 can rotate up to substantially 180 degrees, or more, as shown by Arrow B permitting easy access to interior 17 of the server 10. The greater degree of rotation of flip door 15 relative to sidewall 16 of the chassis 12 affords easier access by a worker to the interior of the chassis 12. This greater ease of access can be exploited in several ways, such as by increasing usability and serviceability of a linking board module or cable routing and will be more user friendly.

Figure 10:
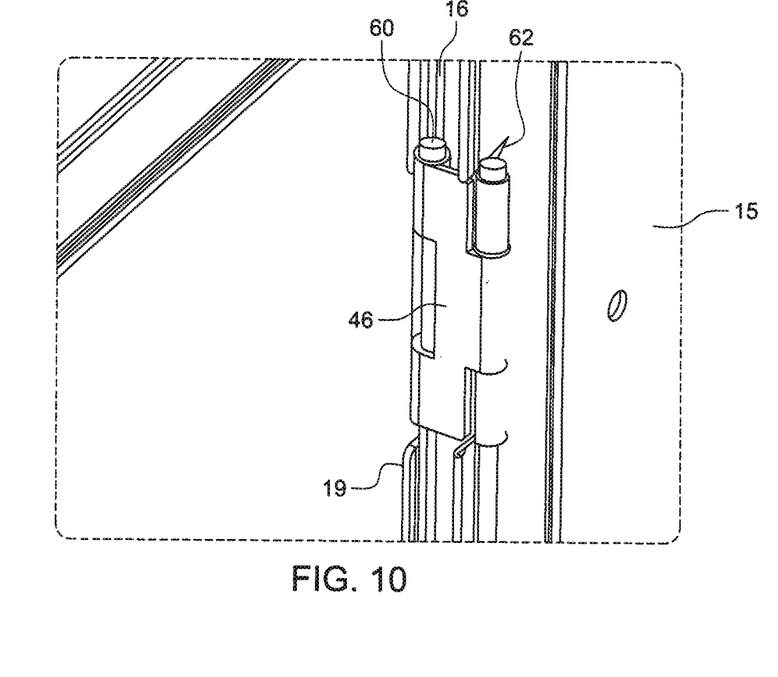
FIG. 10 is an enlarged view, partially in phantom, of the module area of FIG. 9.

FIG. 10 illustrates the dual shafts 60, 62 passing through module 40, the respective edges of flip door 15, and sheet metal edge portion 19 of sidewall 16.

It should be understood that we have illustrated shafts 60, 62 passing through both a module 40 and then through a module 40' (FIGS. 6, 7 and 10). However, if desired, a separate, shorter shaft can be employed only to pass through module 40, and a second separate, shorter shaft can pass through module 40'. However, we have found that the use of a single, elongated shaft passing through both modules 40 and 40' facilitates the assembly of the modules to the flip door 15.

The heretofore description of the use of modules on the sheet metal edge portion 19 and flip door 15 not only increases the degree of rotation of a flip door 15, from an angle of about 110 degrees to an angle of 180 degrees or more, but also affords the opportunity to access the interior 17 of the server 10, and also permits the use of linking board modules to be mounted on the flip door 15 to assist in cabling the sleds 13, 14 within the server.

Figure 11:
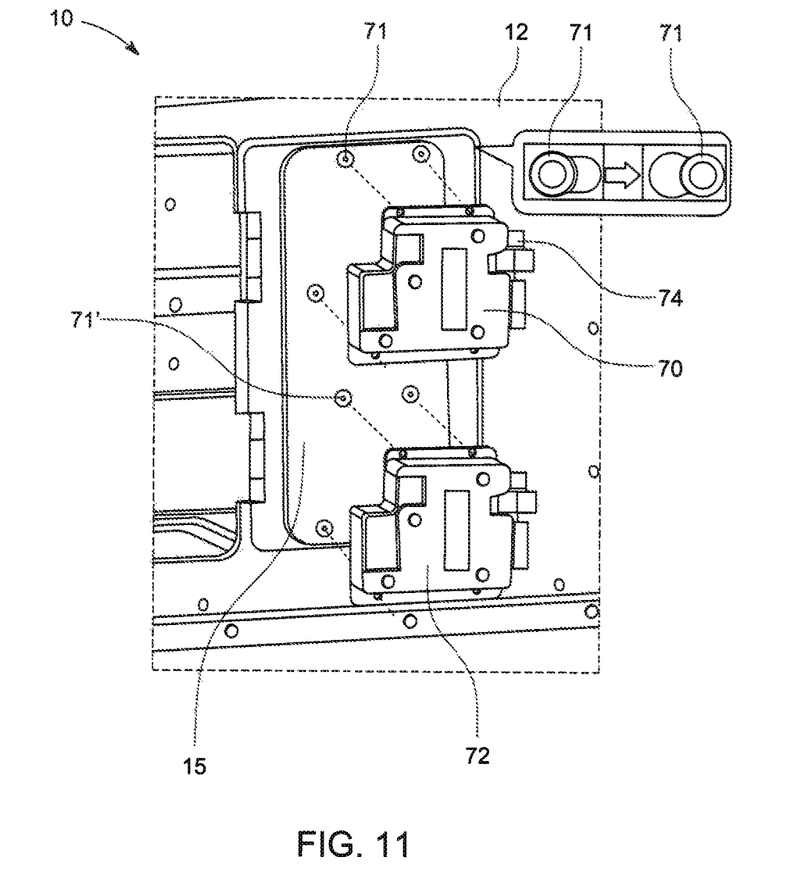
FIG. 11 is a schematic illustration of the assembly mechanism used to mount two linking board modules on the flip door in its opened position.

FIG. 11 illustrates the mounting of an upper linking board module 70 and a lower linking board module 72 to flip door 15. Each of these linking board modules 70, 72 may be provided with a mating connection. The mating connections may vary, but it is envisioned that the linking board modules 70, 72 may be provided with one of a male- or female-guide connector and the sleds provided with a mating connector. As illustrated in FIG. 11, a series of T-pins 71 are provided on flip door 15 in order to mount linking board module 70 to flip door 15. Also are provided a plurality of T-pins 71' on flip door 15 in order to mount linking board module 72 to flip door 15. The dotted lines show the intended alignment or respective lobe-shaped apertures with each respective T-pin. As shown in the enlarged inset of FIG. 11, the respective head of the T-pin will enter the larger portion of the lobed aperture and by relatively moving the T-pin with regard to the lobe-shaped aperture, the head of the T-pin will be captured by the smaller portion of the lobe-shaped aperture to secure the respective linking board module 70 or 72 to flip door 15.

Figure 12A:
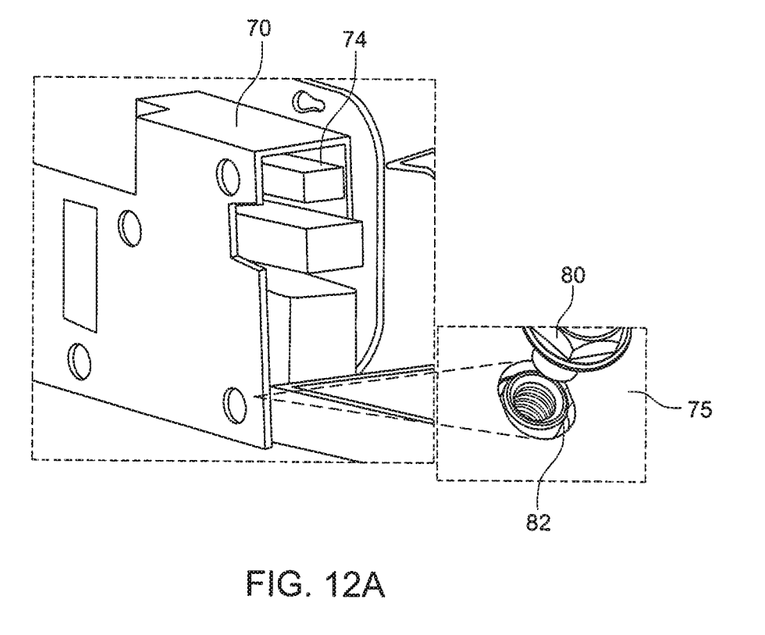
FIG. 12A is an enlarged view of a portion of a single linking module as shown in FIG. 11 to show details of a mounting mechanism to allow the module to float to align a male or a female guide pin connector.
Figure 12B:
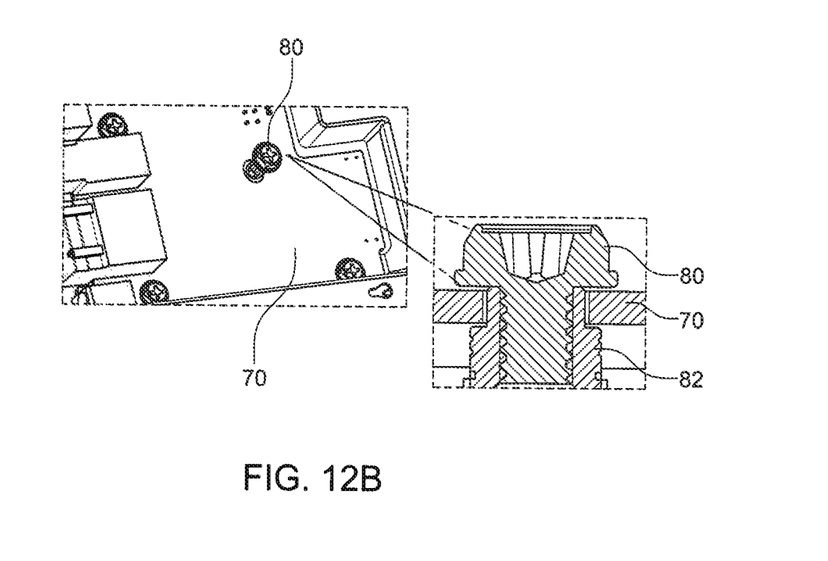
FIG. 12B is an enlarged portion of the linking module of FIG. 12A in order to show details of an attachment system which permits the module to float in order to align a guide pin connector.

An example male guide pin connector 74 is provided on the edge of the linking board module 70, as shown in FIG. 12A. The linking board modules 70, 72 may be mounted to flip door 15 in a floating design fashion 75 by use of a threaded fastener 80 which mates with threaded socket 82 as shown in the enlarged inset of FIG. 12A. In the enlarged view of a portion of linking board module 70 of FIG. 12A, a series of threaded fasteners 80 are used to hold the linking board module in a floating position in order to permit the male guide pin connector 74 to adjust to a respective guide connector on a respective sled (13, 14, not shown in FIG. 12A) when the sled is driven home. The floating design fashion 75 provides holes into which threaded fasteners 80 can pass. The linking board module 70 or 72 and corresponding threaded fasteners 80 will position the linking board modules 70 and 72 in a floating configuration. The shank of the fastener 80 will pass through the hole and engage the threaded socket 82 to capture the linking board module 70 as shown in the enlarged inset of FIG. 12B. However, the head of threaded fastener 80 will contact the top of threaded socket 82 in a manner in which a slight clearance or gap will be formed between the head of threaded fastener 80 and the outer wall of the linking board module 70 as shown in the enlarged inset of FIG. 12B. This allows the linking board modules 70 and 72 to be moveably slightly, relative to the flip door 15, for adjustment and alignment purposes. When the flip door 15 is shut, the male guide pin connector 74 will be facing the open face of the chassis 12. The floating design fashion and the male guiding pin connector 74 make it possible to provide cabling connections to the sleds merely by inserting the sleds 13, 14 into the server 10, and then sliding the sleds 13, 14, home after shutting the door 15. Thus, when the sleds are slid home, the connectors on the sled connect to the male guide pin connector 74. The linking board modules 70 and 72 in this example do not have actual components, but could have more active components.

Figure 13:
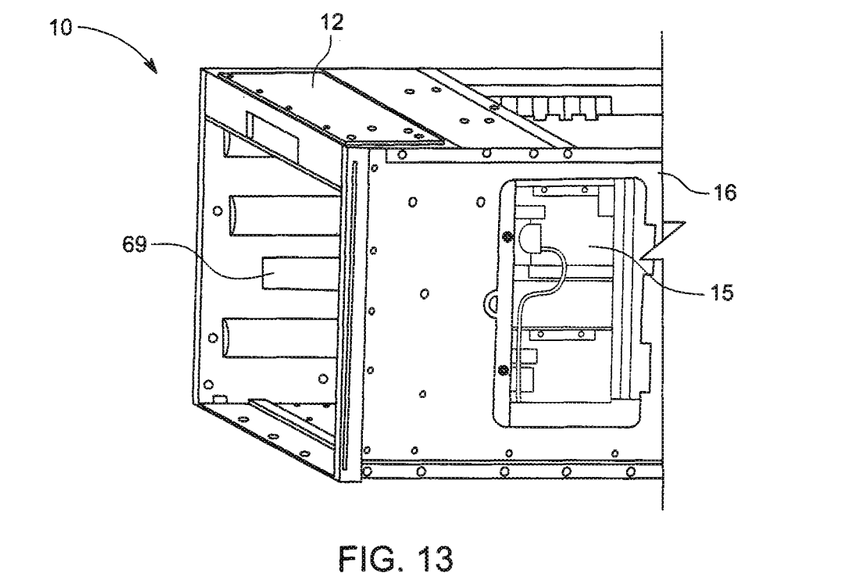
FIG. 13 illustrates the flip door of FIG. 11 in its closed position.

FIG. 13 illustrates the flip door 15 with the linking board modules 70, 72 mounted on the flip door 15, in a closed position ready to receive the sleds 13, 14. The guide pin connectors of the linking board modules 70, 72 will be facing the sleds 13, 14. Rail assembly 69 is visible in the interior of the chassis 12 to receive and allow the sleds 13, 14 to slide home within the chassis 12.

Figure 14:
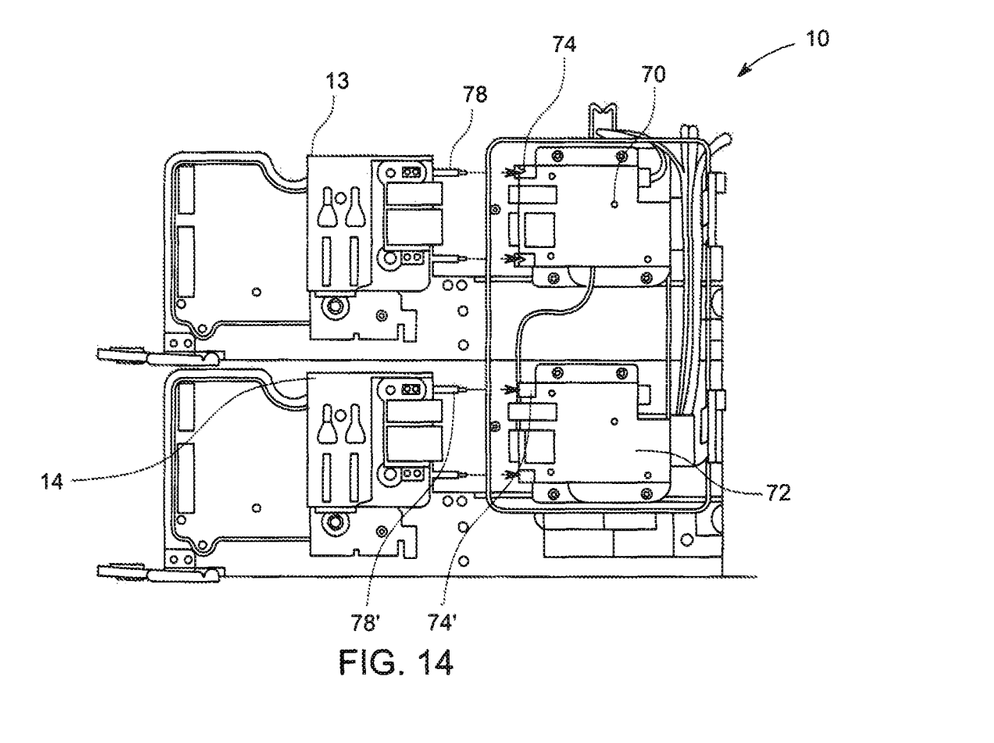
FIG. 14 illustrates the relative position of each of two sleds just prior to their engagement with respective linking board modules on the closed flip door carrying the same.

FIG. 14 schematically illustrates each of sleds 13, 14 being slid home within the server 10. The linking board module 70 is positioned, with its male guide pin connector 74 ready to receive a female guide pin connector 78 on sled 13. Once slid home, sled 13 will automatically position and connect the female guide pin connector 78 with the male guide pin connector 74, thereby completing the cabling. A corresponding female guide pin connector 78' is provided on sled 14 and a male guide pin connector 74' is provided on linking board module 72. They can be cabled and joined in a manner similar to that described in connection with sled 13 and the linking board module 70. Although the male guide pin connectors 74, 74' on the linking board modules 70 and 72 and the female guide pin connectors 78, 78' on the sleds 13, 14 are described in the above example, it is within the scope of the disclosure to reverse the arrangement of the male guide pin connector and female guide pin connector. Other connectors may be used such as a hole and pin arrangement.

The specification and drawings are accordingly to be regarded in an exemplary, rather than a restricted sense. It will be evident to those skilled in the art, to whom this disclosure is directed, that various modifications and changes can be made to the various embodiments disclosed herein without departing from the broader spirit and scope of the patent application, as set forth in the claims.

We claim:

1. A module assembly for mounting a flip door on a side wall of a chassis such that the flip door rotates through an angle of at least 180°, the module assembly comprising:
   a central core; the central core defining an upper first shaft receiving portion and a lower first shaft receiving portion; each of the upper and the lower first shaft receiving portions being configured in axial alignment; the module assembly further including a second shaft receiving portion; the second shaft receiving portion being offset on the central core with regard to the upper first shaft receiving portion and the lower first shaft receiving portion such that it is not in axial alignment with either the upper or the lower first shaft receiving portions;
   the module assembly further comprising a first shaft engaging both the upper and the lower first shaft receiving portions; and
   the module assembly further comprising the chassis, wherein the chassis comprises a sheet metal sidewall; and, wherein the sheet metal sidewall comprises a first sheet metal edge, the first sheet metal edge defining an opening to receive the first shaft.

2. The module assembly of claim 1, further comprising a second shaft, the second shaft engaging the second shaft receiving portion of the module assembly.

3. The module assembly of claim 2, wherein the upper and the lower first shaft receiving portions of the module assembly are aligned with the opening in the first sheet metal edge of the chassis sidewall.

4. The module assembly of claim 3, wherein the first shaft passes through each of the upper and the lower first shaft receiving portions of the module assembly and the opening defined in the first sheet metal edge of the sidewall of the chassis.

5. The module assembly of claim 4, further comprising the flip door.

6. The module assembly of claim 5, wherein the flip door comprises a second sheet metal edge, the second sheet metal edge configured as a geometry defining a second shaft engaging upper portion and a second shaft engaging lower portion in axial alignment on the flip door.

7. The module assembly of claim 6, wherein the second shaft is configured to engage the second shaft engaging upper portion and the second shaft engaging lower portion of the flip door in axial alignment with the second shaft receiving portion of the module assembly.

8. The module assembly of claim 7, wherein the second shaft is configured to engage with the second sheet metal edge upper portion and the second sheet metal edge lower portion and the second shaft receiving portion of the module assembly.

9. The module assembly of claim 7, wherein the flip door is capable of rotating more than 180° with regard to the first sheet metal edge of the chassis.

* * * * *